United States Patent [19]

Elliott

[11] Patent Number: 5,074,139
[45] Date of Patent: Dec. 24, 1991

[54] ROLL FORMING OF SEMICONDUCTOR COMPONENT LEADFRAMES

[75] Inventor: Alexander J. Elliott, Mesa, Ariz.

[73] Assignee: Motorola, Inc., Schaumburg, Ill.

[21] Appl. No.: 664,234

[22] Filed: Mar. 4, 1991

[51] Int. Cl.⁵ .............................................. B21F 45/00
[52] U.S. Cl. ........................................ 72/129; 72/181; 72/199; 72/338; 29/827; 140/105
[58] Field of Search ................. 72/181, 199, 129, 338, 72/365.2, 366.2, 180; 29/827, 829; 140/105

[56] References Cited

U.S. PATENT DOCUMENTS

| | | | |
|---|---|---|---|
| 3,416,348 | 12/1968 | Carter | 29/827 |
| 3,900,053 | 8/1975 | Weresch | 140/105 |
| 4,558,581 | 12/1985 | Goulstone | 72/199 |
| 4,827,669 | 5/1989 | Nakajima | 72/337 |

FOREIGN PATENT DOCUMENTS

| | | | |
|---|---|---|---|
| 3561 | 4/1963 | Japan | 140/105 |
| 89947 | 5/1985 | Japan | 29/827 |
| 69158 | 4/1986 | Japan | 29/827 |
| 175249 | 7/1989 | Japan | 29/827 |

*Primary Examiner*—Daniel C. Crane
*Attorney, Agent, or Firm*—Joe E. Barbee

[57] ABSTRACT

A method by which leads of a semiconductor component are bent into their final shape using a roll forming process to bend the leads into the desired shape before separation of the individual components. The roll forming process achieves a final form by passing a lead frame holding a plurality of the semiconductor components through a series of form rollers which progressively bend the leads into the final shape. The method can be designed to cut the components free from the lead frame as a final step, minimizing the individual handling of the miniaturized components.

7 Claims, 4 Drawing Sheets

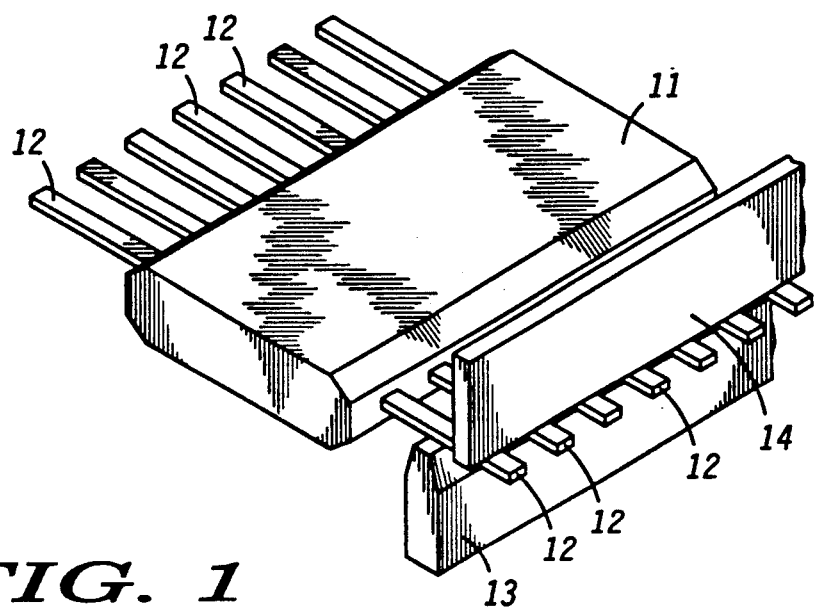
FIG. 1
-PRIOR ART-
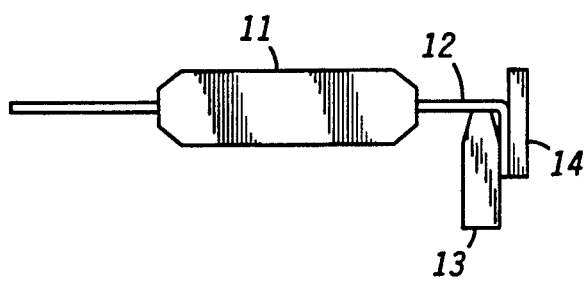
FIG. 2
-PRIOR ART-
FIG. 3
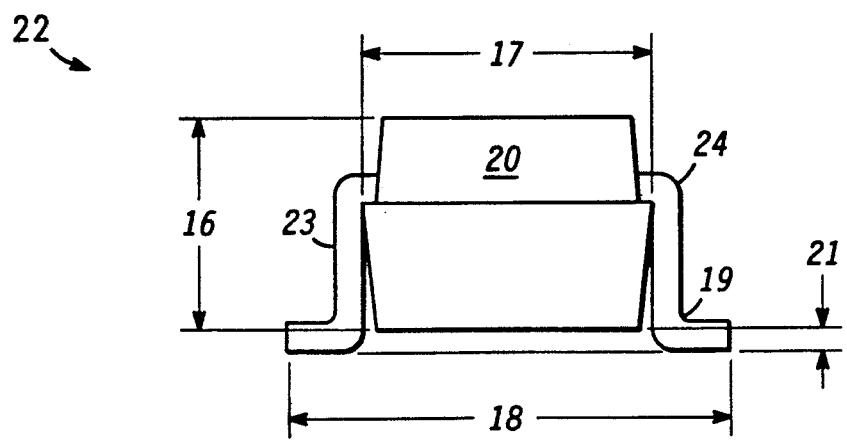

5,074,139

ROLL FORMING OF SEMICONDUCTOR COMPONENT LEADFRAMES

BACKGROUND OF THE INVENTION

The present invention relates, in general, to forming of component leads, and more particularly to forming of package leads for semiconductor components.

One of the critical steps in the manufacture of a semiconductor component is the forming of package leads into their final shape. This operation is particularly critical since it takes place as one of the final steps of a complex multi-step process. A single damaged lead in a multiple lead package results in scrapping of an otherwise useable and expensive component. The small size of many packages makes precise formation of leads essential, yet the operation must be performed rapidly so as not to add unduly to the product cost. The advent of surface mounted technology (SMT) has further complicated this problem since multiple bends in these critical leads are now required. Typical packages for the smallest components are approximately 2 mm by 1.25 mm by 0.9 mm making any manual handling of individual components a difficult task. In the past, a hydraulic press has been used to bend the leads after the components have been separated from the lead frame by a separate cutting process. This requires that individual components be handled both before the leads are formed as well as afterwards. Because of the small size and tight tolerances required, it is difficult to locate the separated components on the press precisely enough to achieve the required final form dimensions. Finally, the motion of the former die past the leads may cause "smearing" of the lead surface, damaging the lead and causing the entire semiconductor component to be scrapped.

There is a need for a method to bend semiconductor component leads into their final shape which is fast, accurate, and does not have the potential to damage the leads or the component during the forming process. Preferably the method would allow the components to be handled in bulk as much as possible to minimize the difficult handling of small components.

SUMMARY OF THE INVENTION

Briefly stated, the present invention provides a method by which the leads of semiconductor components such as switching diodes, discrete transistors, and integrated circuits may be bent into their final shape by using a roll forming process to bend the lead frame into the desired shape before separation of the individual components. This method allows the semiconductor components to be handled in groups on a lead frame until the final step, it is a continuous flow process which therefore is extremely fast, and provides accurate bending without the potential for damage to the leads.

BRIEF DESCRIPTION OF THE DRAWINGS

FIG. 1 shows a partial perspective view of a press typical of the prior art;

FIG. 2 shows an end view of the press shown in FIG. 1 in a fully lowered position;

FIG. 3 shows an end view of a typical small outline semiconductor device package;

DETAILED DESCRIPTION OF THE DRAWINGS

Figure 4:
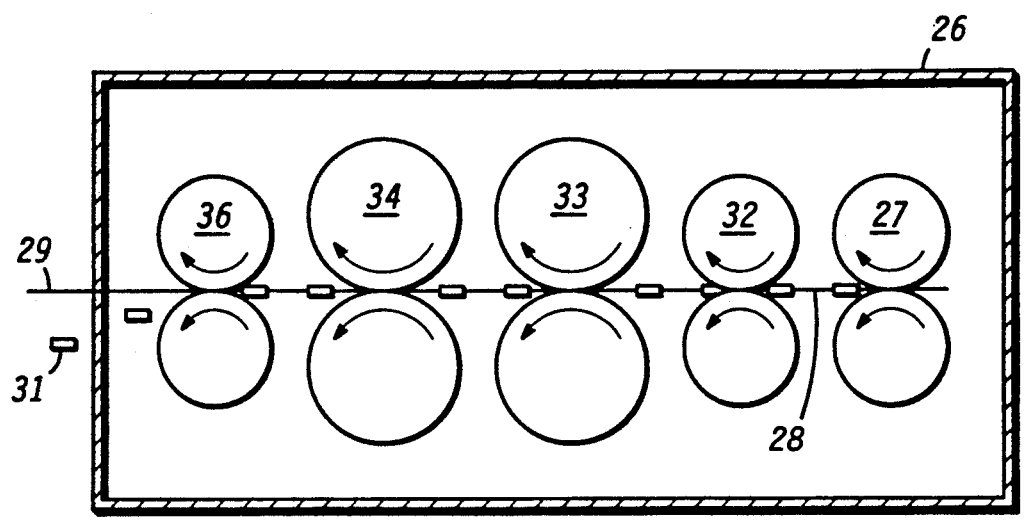
FIG. 4 is a schematic side view of a roll forming machine which embodies the present invention.

FIG. 1 shows a partial perspective view of a press typical of the prior art. This prior art press appears in more detail in U.S. Pat. No. 4,553,420, "Method and Apparatus for Touch-free Lead Bending" granted to R. H. J. Fierkens et al on Nov. 19, 1985. A typical semiconductor component 11 having a plurality of leads 12 is held against an anvil 13. A press 14 is lowered past anvil 13 bending leads 12 into the desired shape.

FIG. 2 shows an end view of the press shown in FIG. 1 in a fully lowered position. Press 14 is lowered past anvil 13 in this view, resulting in a single right angle bend in leads 12. A press such as this is adequate for large packages requiring only a single bend in the leads, but is a relatively slow operation and risks damage to leads 12 as press 14 is lowered. The damage to leads 12 is due to metal being either scratched or stretched on the surface when another surface is pulled across the surface under pressure. This damage weakens the metal of leads 12 and can cause premature failure of the leads resulting in semiconductor component 11 being scrapped.

FIG. 3 shows an end view of a typical small outline semiconductor device package. Small outline packages similar to the one shown are commonly used to mount small semiconductor devices such as switching diodes, discrete transistors, and small integrated circuits. This package is designed to utilize surface mounted technology (SMT) which requires that the leads have two bends made to extremely precise tolerances. A package 22 comprises a molded plastic body 20, and a plurality of leads 23. Molded plastic body 20 has a width 17 of 1.300 mm, and a height 16 of 0.9500 mm. Leads 23 must have a projection 21 of no more than 0.1 mm below molded plastic body 20. Leads 23 are formed with a first right angle bend 24 and a second right angle bend 19. Right angle bend 19 has a radius of 0.130 mm. Leads 23 must be cut off to leave an overall width 18 of 2.110 mm. Typical tolerances are 0.025 mm for all of these dimensions.

To bend these leads 23 using an anvil and press, according to the prior art, necessitates a second bending step further increasing the potential for damage or handling error. Separation of packages 22 from the leadframes used during manufacture must also be performed as yet another separate step. Individual handling of packages 22 which are barely 2 mm across is extremely difficult and requires special handling techniques. Accurate alignment of such components in a press is even more difficult to achieve. The small size of package 22 makes the potential for damage to leads 23 more likely and the consequences more severe.

Clearly there is a need for a new way to bend leads 23. The solution is found in a new application of the old technique of roll forming. This type of metal forming process is well known in the fabrication of large metal shapes such as forming metal plates for ship construction, fabrication of pipes and similar sheet metal parts. The roll forming technique as applied to large sheet metal bending is described fully in Chapter eight of "Tool and Manufacturing Engineers Handbook", editor Charles Wick, copyright 1983, 1984 Society of Manufacturing Engineers. However this process has not previously been applied to very small metal component fabrication such as the bending of the leads of a semiconductor component. The roll forming process achieves a final form by passing the lead frame through a series of form rollers which progressively bend the lead frame into the final shape. The flow of components through the roll forming apparatus is essentially a continuous one resulting in a very high rate of production.

During final assembly, semiconductor components are typically mounted on leadframes which comprise a mounting surface for the chip itself, all leads required for the finished component, and a supporting frame. Typically the supporting frame is designed with features such as sprocket holes and shorting bars to facilitate handling of the semiconductor component without the potential for damage. The sprocket holes are also useful for obtaining an exact alignment of the semiconductor component during the assembly process. Semiconductor components must then be cut from the lead frame during the assembly process. The roll forming process can be designed to cut the components free from the lead frame as a final step, minimizing the individual handling of the tiny components. Alignment of the component for such operations as bending of leads can now take place with the individual components still attached to the lead frame. Since the lead frame is designed to hold the components precisely in a predetermined position this alignment is much simplified. The lead frame is also designed to provide protection from damage for the components, both from physical abuse and from electrostatic discharge. Keeping the components mounted in the lead frame until the final manufacturing step extends this protection to the maximum. An alternative embodiment of the present invention allows roll forming of leads where the components are separated from the lead frame or other support prior to bending. The present invention provides for application of the roll forming technique to bending of the leads of a semiconductor device.

FIG. 4 is a schematic side view of a roll forming machine as a preferred embodiment of the present invention. A roll forming machine 26 holds a plurality of roller sets comprising a first roller set 27, a second roller set 32, a third roller set 33, a fourth roller set 34 and a fifth roller set 36. Roller sets 27, 32, 33, 34 and 36 in turn comprise a plurality of forming rollers which in a preferred embodiment are fabricated from a carbide hardened rolled steel material. A lead frame 28 comprises a plurality of semiconductor devices held in place by a metal frame during manufacture. Lead frame 28 is passed through the series of roller sets 27, 32, 33, 34 and 36, each roller set progressively bending the lead frame into the desired shape. The fifth and final roller set 36 acts to separate lead frame 28 into a plurality of semiconductor devices 31 from excess portions of lead frame 28 leaving a quantity of lead frame scrap 29. Lead frame scrap 29 comprises the portion of the lead frame intended for handling and support during the manufacturing process and serves no purpose for the finished semiconductor component. There are many alternate embodiments of this invention which use either more roller sets or fewer roller sets to form the lead frame. The number of roller sets used in a particular embodiment will differ depending upon the complexity of the bending required, the size of lead frame 28, and the speed of operation desired. It should be understood that there exist a wide variety of different forming angles and different roller configurations which yield the same result as that described for a preferred embodiment without affecting the functioning of this invention.

Figure 5:
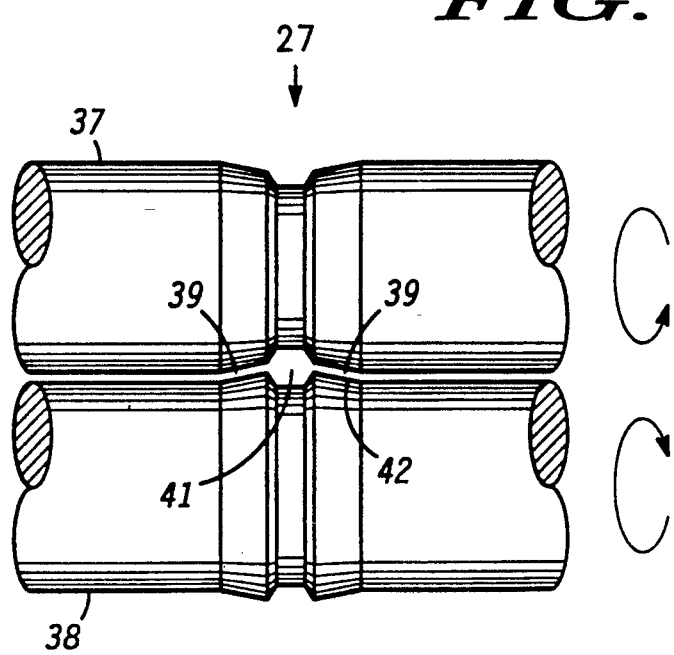
FIG. 5 shows a detailed front view of a first roller set as a part of the roll forming machine shown in FIG. 4.

FIG. 5 shows a detailed front view of first roller set 27, which is part of the roll forming machine shown in FIG. 4, as a preferred embodiment of the present invention. First roller set 27 comprises a single top roller 37 and a single bottom roller 38. Rollers 37 and 38 each have a pair of bending surfaces 39 and a body cavity 41. Bending surfaces 39 form a bending angle 42 which is approximately 25 degrees in a preferred embodiment. Bending surfaces 39 protrude from bottom roller 38 and form a matching depression in top roller 37. Bending surfaces 39 are symmetrical about the center of body cavity 41. Body cavity 41 is shaped so as to allow molded plastic body 20 (FIG. 3) to pass through roller set 27 freely yet be held in alignment. Alternative embodiments of this invention may incorporate a different angle for bending angle 42, interchange top roller 37 and bottom roller 38, be asymmetric with respect to body cavity 41, or have body cavity 41 shaped to apply a predetermined amount of pressure to molded plastic body 20 (FIG. 3).

Figure 6:
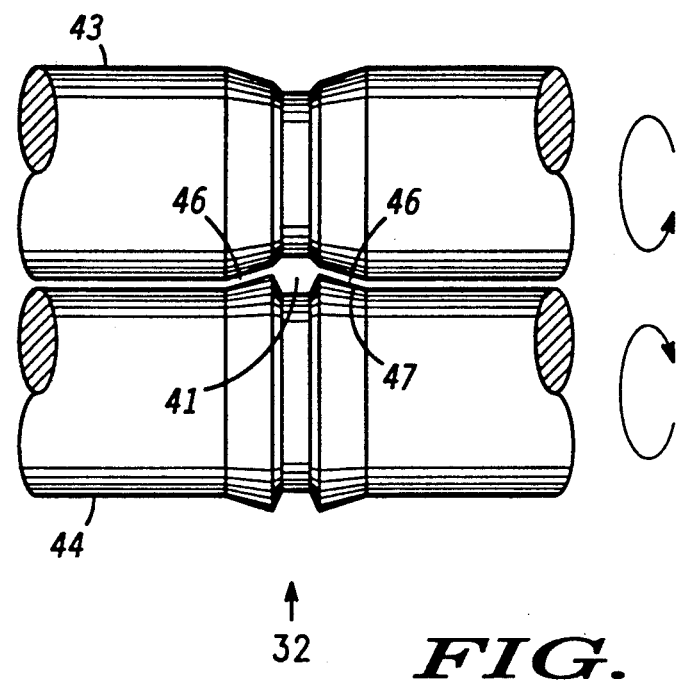
FIG. 6 shows a detailed front view of a second roller set as a part of the roll forming machine shown in FIG. 4.

FIG. 6 shows a detailed front view of second roller set 32, which is part of the roll forming machine shown in FIG. 4, as a preferred embodiment of the present invention. Second roller set 32 comprises a single top roller 43 and a single bottom roller 44. Rollers 43 and 44 each have a pair of bending surfaces 46 and body cavity 41. Bending surfaces 46 form a bending angle 47 which is approximately 50 degrees in a preferred embodiment. Second roller set 32 is otherwise similar to first roller set 27 (FIG. 5) including the various alternative embodiments. For the sake of brevity, these similar features will not be repeated here but should be understood to apply to second roller set 32.

Figure 7:
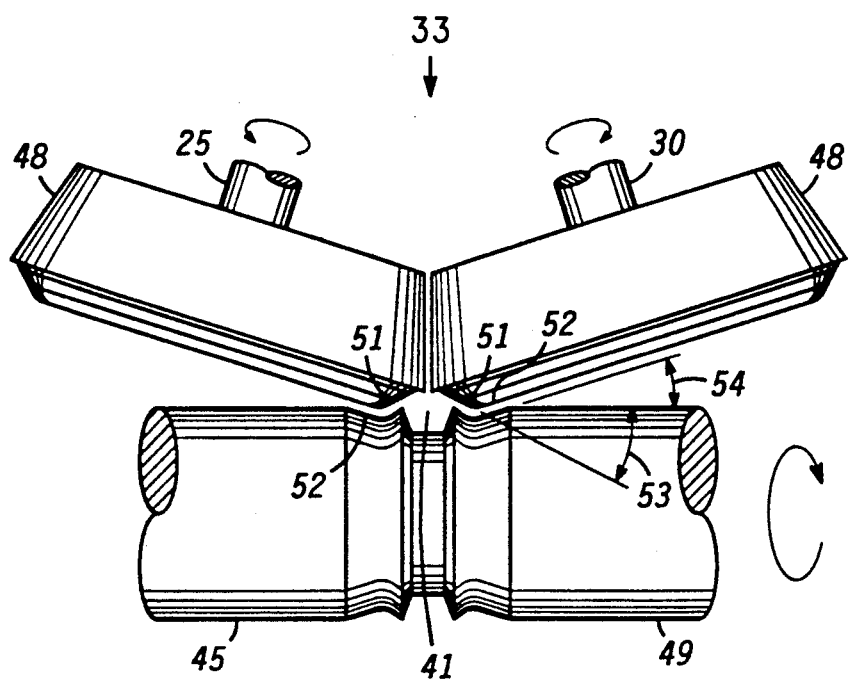
FIG. 7 shows a detailed front view of a third roller set as a part of the roll forming machine shown in FIG. 4.

FIG. 7 shows a detailed front view of third roller set 33, which is part of the roll forming machine shown in FIG. 4, as a preferred embodiment of the present invention. Third roller set 33 initiates the forming of right angle bend 19 (FIG. 3) and hence uses a slightly different configuration of rollers than was used for roller sets 27 and 32. Third roller set 33 comprises a pair of identical top rollers 48 and a single bottom roller 49, each roller is positioned and driven by a separate drive shaft 25, 30, and 45 respectively. Identical top rollers 48 each have a first bending surface 51, a second bending surface 52 and body cavity 41. Bottom roller 49 has bending surfaces 51 and 52 on either side of body cavity 41. Bending surfaces 51 form a bending angle 53 on the portion of leads 23 (FIG. 3) closest to molded plastic body 20. Bending angle 53 is approximately 70 degrees. Bending surfaces 52 form a bending angle 54 of approximately 40 degrees, resulting in an initial bend of approximately 110 degrees in leads 23 (FIG. 3). Third roller set 33 is otherwise similar to first roller set 27 (FIG. 5) including the various alternative embodiments. For the sake of brevity, these similar features will not be repeated here but should be understood to apply to third roller set 33.

Figure 8:
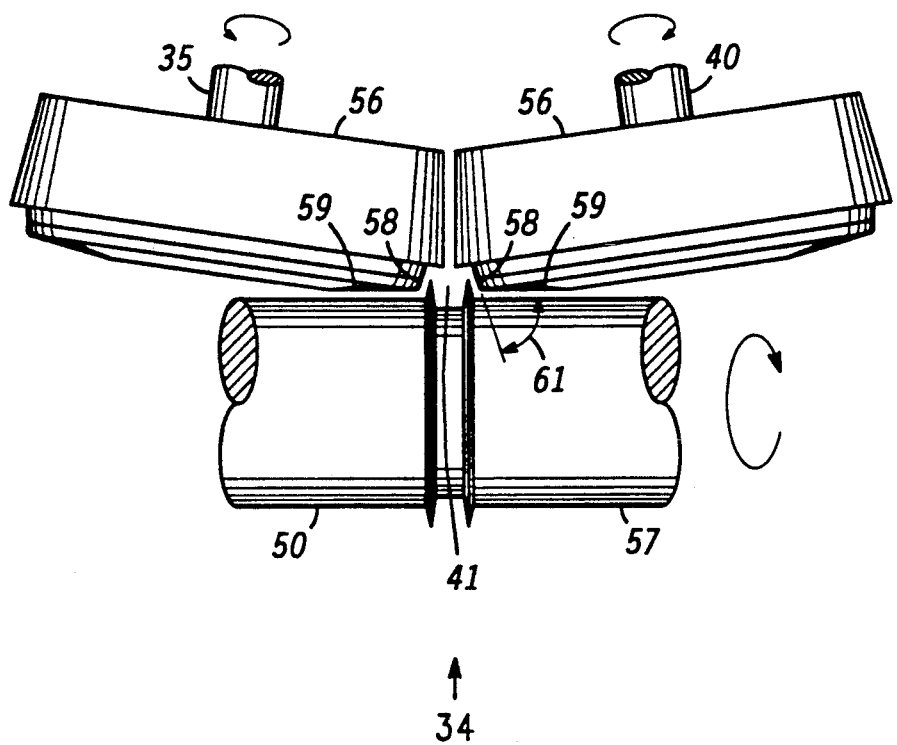
FIG. 8 shows a detailed front view of a fourth roller set as a part of the roll forming machine shown in FIG. 4.

FIG. 8 shows a detailed front view of fourth roller set 34, which is part of the roll forming machine shown in FIG. 4, as a preferred embodiment of the present invention. Fourth roller set 34 continues the forming of right angle bend 19 (FIG. 3) and hence uses three rollers in a similar fashion to third roller set 33. Fourth roller set 34 comprises a pair of identical top rollers 56 and a single bottom roller 57, each roller is positioned and driven by a separate drive shaft 35, 40, and 50 respectively. Identical top rollers 56 each have a first bending surface 58, a second bending surface 59 and body cavity 41. Bottom roller 57 has bending surfaces 58 and 59 on either side of body cavity 41. Bending surfaces 58 form a bending angle 61 on the portion of leads 23 (FIG. 3) closest to molded plastic body 20. Bending angle 61 is approximately 80 degrees. Bending surfaces 59 are level with the upper surface of bottom roller 57, resulting in a second bend of approximately 100 degrees in leads 23 (FIG. 3). Fourth roller set 34 is otherwise similar to first roller set 27 (FIG. 5) including the various alternative embodiments. For the sake of brevity, these similar features will not be repeated here but should be understood to apply to fourth roller set 34.

Figure 9:
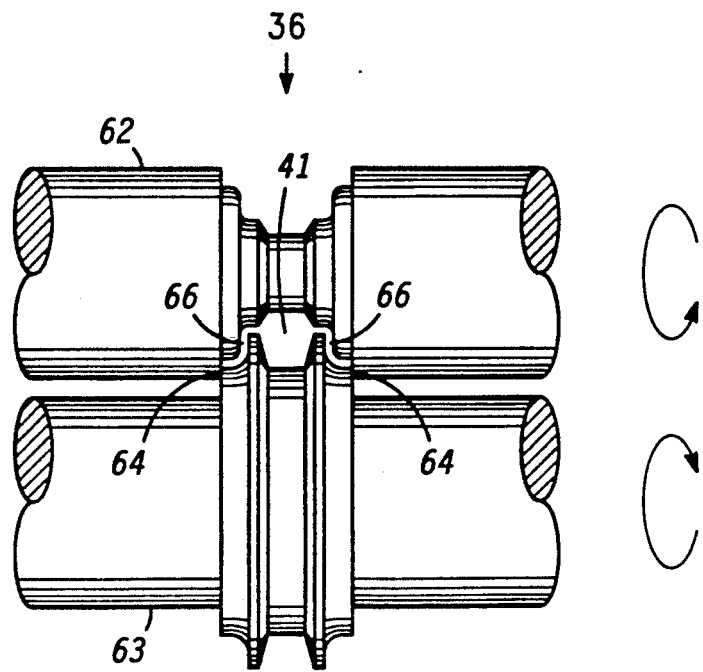
FIG. 9 shows a detailed front view of a fifth roller set as a part of the roll forming machine shown in FIG. 4.

FIG. 9 shows a detailed front view of fifth roller set 36, the final roller set of the roll forming machine shown in FIG. 4, as a preferred embodiment of the present invention. Fifth roller set 36 comprises a single top roller 62 and a single bottom roller 63. Rollers 62 and 63 each have a cutting surface 64, a final forming surface 66 and body cavity 41. Cutting surface 64 serves to cut leads 23 (FIG. 3), thus separating semiconductor devices 31 (FIG. 4) from lead frame 28 (FIG. 4), leaving lead frame scrap 29 (FIG. 4). Final forming surface 66 is shaped such that leads 23 are accurately formed into the shape and dimensions desired. Fifth roller set 36 is otherwise similar to first roller set 27 (FIG. 5) including the various alternative embodiments. For the sake of brevity, these similar features will not be repeated here but should be understood to apply to fifth roller set 36.

By now it should be apparent that application of the roll forming process to the bending of semiconductor component leads into their final shape provides several advantages over the prior art method. The roll forming process is a continuous one allowing the rapid processing of components without interruption, the potential for damage to the leads and the component during the bending process is minimized, and accurate lead bending is easily obtained. Delaying separation of the components from their leadframes until the final roller set allows all preceding operations to handle the components in bulk rather than individually. The lead frame also provides electrical and physical protection for the component, this protection can now be maintained until the final assembly step.

I claim:

1. A method for roll forming of semiconductor component leads, comprising:
    feeding a plurality of packaged semiconductor components on a lead frame along a path,
    passing the plurality of packaged semiconductor components on the lead frame through a plurality of forming roller sets arranged along the path wherein each of the roller sets imparts an increasing bend to the semiconductor component leads until a predetermined shape is achieved.

2. The method for roll forming of semiconductor component leads of claim 1 further comprising:
    cutting away excess portions of the lead frame by a final roller set to separate individual semiconductor components from the lead frame.

3. The method for roll forming of semiconductor component leads of claim 1 wherein the plurality of forming rollers are fabricated from a carbide hardened rolled steel material.

4. A method for roll forming of semiconductor component leads, comprising:
    providing a plurality of semiconductor component leads in a lead frame with the component leads arranged along a path,
    shaping the plurality of semiconductor component leads into a predetermined shape by progressive bending solely from a succession of forming rollers located along the path wherein the component leads are moved along the path to bend the component leads out of the path.

5. The method for roll forming of semiconductor component leadframes of claim 4 wherein a final roller serves to separate a handling and support segment of the semiconductor component lead frame from the segment which comprises the finished semiconductor components.

6. A method for roll forming of semiconductor component leads wherein a semiconductor component having a plurality of semiconductor component leads is held in a semiconductor lead frame, comprising:
    moving the lead frame along a path,
    shaping the plurality of semiconductor component leads into a predetermined shape by progressive bending solely by a succession of forming rollers arranged along the path and where the last roller of the succession also separates the semiconductor component from the semiconductor component lead frame.

7. A method for roll forming of semiconductor component leads, comprising:
    bending a plurality of semiconductor component leads a small amount by a first roller set to provide a first bend;
    increasing the first bend by a second roller set;
    shaping the leads by further increasing the angle of the first bend and starting a second bend by a third roller set, the third roller set comprising a bottom roller mating with two top rollers;
    further shaping the leads by further increasing the angle of the first and second bends by a fourth roller set, the fourth roller set comprising a bottom roller mating with two top rollers; and
    forming of a final predetermined shape and also separating a semiconductor component from a semiconductor component lead frame by a fifth roller set.

* * * * *